United States Patent
Burns et al.

(10) Patent No.: US 7,724,159 B2
(45) Date of Patent: May 25, 2010

(54) SYSTEM, METHOD, AND/OR APPARATUS FOR DIGITAL SIGNAL SORTING

(75) Inventors: Gregory Burns, Seattle, WA (US); Phillip Rutschman, Seattle, WA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/840,887

(22) Filed: Aug. 17, 2007

(65) Prior Publication Data

US 2009/0045990 A1 Feb. 19, 2009

(51) Int. Cl.
*H03M 7/00* (2006.01)
(52) U.S. Cl. .......................................... 341/50; 375/152
(58) Field of Classification Search ............. 341/50–90; 705/26, 30, 80; 704/503; 375/140–152
See application file for complete search history.

(56) References Cited

U.S. PATENT DOCUMENTS

| | | | |
|---|---|---|---|
| 5,379,351 A | | 1/1995 | Fandrianto et al. |
| 6,016,112 A | * | 1/2000 | Knudsen ...................... 341/118 |
| 6,049,298 A | * | 4/2000 | Knudsen ...................... 341/118 |
| 6,629,081 B1 | * | 9/2003 | Cornelius et al. ............. 705/30 |
| 7,069,234 B1 | * | 6/2006 | Cornelius et al. ............. 705/26 |
| 7,167,844 B1 | * | 1/2007 | Leong et al. .................. 705/80 |

OTHER PUBLICATIONS

Burrows M. and Wheeler D.J., "A Block-sorting Lossless Data Compression Algorithm", Technical Report 124, Digital Equipment Corporation, May 10, 1994.
Knuth, Donald, The Art of Computer Programming, vol. 2: Seminumerical Algorithms, Third Edition. Addison-Wesley, 1997. ISBN 0-201-89684-2, pp. 65-66, 77-78, 80-81, 91, 145-148, 154, 384, 460, and 679.
McCaffrey, James, "Using Permutations in .NET for Improved Systems Security", Aug. 2003, http://msdn2.microsoft.com/en-us/library/aa302371.aspx.
Jie Liang and Trac D. Tran, "Fast Multiplierless Approximations of the DCT With the Lifting Scheme", IEEE Transactions on Signal Processing, vol. 49, No. 12, Dec. 2001, pp. 3032-3044.
Zhongde Wang, "Fast Algorithms for the Discrete W Transform and for the Discrete Fourier Transform", IEEE Transactions on Acoustics, Speech, and Signal Processing, vol. 32, ASSP-32, No. 4, Aug. 1984, pp. 803-816.
Geiger, Ralf et al., "Audio Coding based on Integer Transforms", 111th AES Convention, Convention Paper #5471, Sep. 2001.

* cited by examiner

*Primary Examiner*—Lam T Mai
(74) *Attorney, Agent, or Firm*—Timothy F. Loomis; Espartaco Diaz Hidalgo

(57) ABSTRACT

Embodiments of methods, apparatuses, devices and systems associated with ordering and/or reordering a set of digital signal sample values are disclosed.

62 Claims, 2 Drawing Sheets

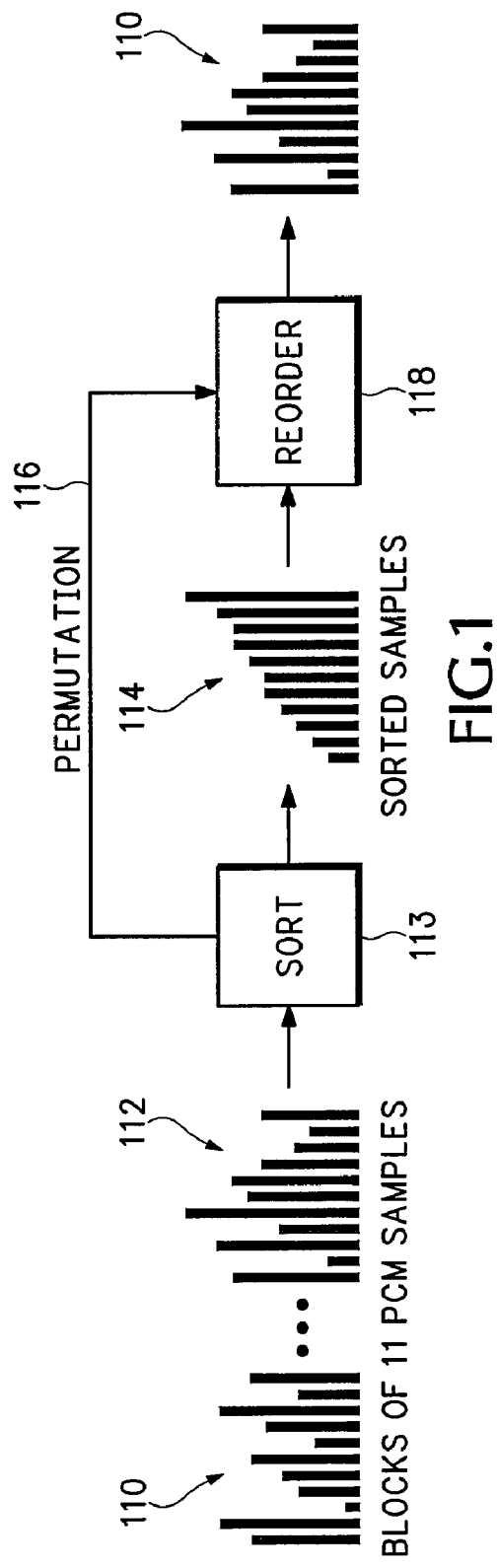
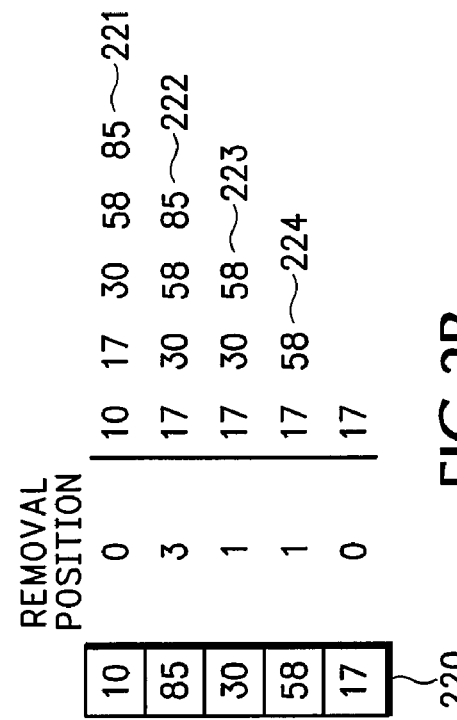
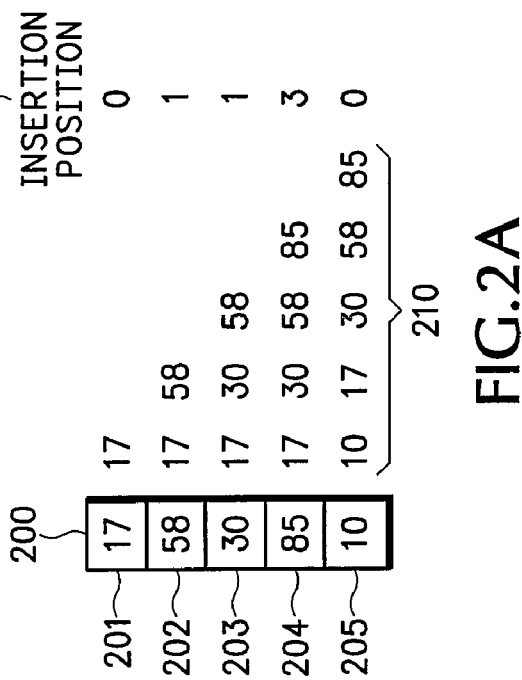

SYSTEM, METHOD, AND/OR APPARATUS FOR DIGITAL SIGNAL SORTING

FIELD

The present disclosure relates to sorting digital signals.

BACKGROUND

In a variety of contexts, it is desirable to have the ability to compress signals, such as digital signals. Approaches to accomplish this continue to be sought by engineers, scientists and technologists.

BRIEF DESCRIPTION OF DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

FIG. 1 is a schematic diagram for sorting digital signals in accordance with one possible embodiment;

FIG. 2A is a schematic diagram of a set of unsorted digital signals in accordance with the embodiment of FIG. 1;

FIG. 2B is a schematic diagram of a set of sorted digital signals in accordance with the embodiments of FIGS. 1 and 2;

DETAILED DESCRIPTION

Figure 3:
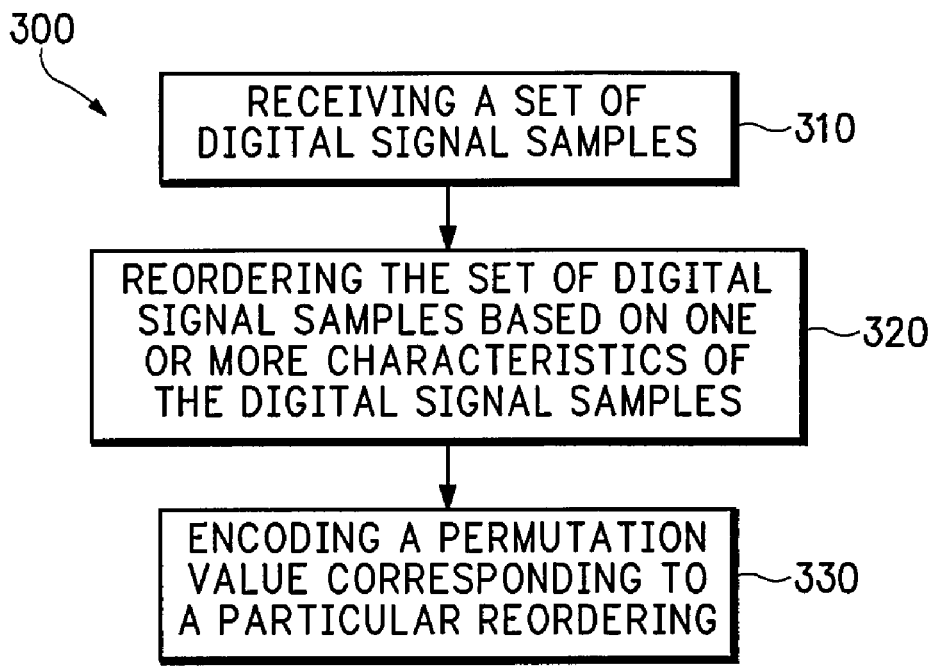
FIG. 3 is a flow chart of a sort process in accordance with another possible embodiment.

In the following detailed description, numerous specific details are set forth to provide a thorough understanding of the claimed subject matter. However, it will be understood by those skilled in the art that claimed subject matter may be practiced without these specific details. In other instances, methods, procedures, and/or components that would be known by one of ordinary skill have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, appearances of the phrase "in one embodiment" and/or "an embodiment" in various places throughout this specification are not necessarily all referring to the same embodiment or to any one particular embodiment described. Furthermore, particular features, structures, and/or characteristics may be combined in various ways in one or more embodiments. In general, of course, these and other issues may vary with the particular context. Therefore, the particular context of the description and the usage of these terms may provide helpful guidance regarding inferences to be drawn for that particular context.

Likewise, the terms, "and," "or," and "and/or" as used herein may include a variety of meanings that will depend at least in part upon the context in which it is used. Typically, "and/or" if used to associate a list, such as A, B and/or C, is intended to mean A, B, or C as well as A, B and C. Though, it should be noted that this is merely an illustrative example and claimed subject matter is not limited to this example.

Unless specifically stated otherwise, throughout this specification, terms such as "processing," "computing," "calculating," "selecting," "forming," "enabling," "inhibiting," "identifying," "initiating," "querying," "obtaining," "hosting," "maintaining," "representing," "modifying," "receiving," "transmitting," "storing," "authenticating," "authorizing," "hosting," "determining" and/or the like refer to actions and/or processes that may be performed by a system, such as a computer and/or other computing platform, capable of manipulating and/or transforming data which may be represented as electronic, magnetic and/or other physical quantities within the system's processors, memories, registers, and/or other information storage, transmission, reception and/or display devices. Accordingly, a computing platform refers to a system or a device that includes the ability to process and/or store data in the form of signals or electronic data. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform FIG. 1 depicts a schematic diagram of a system or a process for sorting signals in accordance with one possible embodiment, here embodiment 100. In this particular embodiment, digital signals are sorted, as explained in more detail hereinafter. Under some circumstances it may be desirable to sort and/or unsort digital signals as part of an encoding method, such as an compression or decompression scheme, for example. For example, under some circumstances it may be possible to achieve desired compression by encoding a sorted set of digital signals based at least in part on a difference in magnitude between adjacent signals. Accordingly, under those circumstances it may be desirable to sort the signals and generate a permutation value for the sorted signals. In this way, the signals may be encoded in a manner that achieves desirable compression while still allowing the signals to be restored as part of a decompression scheme.

Claimed subject matter is not limited in scope in this respect; however, embodiment 100 will be discussed with respect to an audio sample or audio digital signal sample. As used herein an "audio sample" or "audio digital signal" may mean one digital signal sample value or a group of digital signal sample values with the one or more values corresponding to one or more aspects of audio content; however, it is, of course, understood, that audio digital signal samples are provided merely as an illustrative example. Many other types and varieties of signals may be sorted in accordance with claimed subject matter beyond audio content in the form of signals. To provide only a few examples, text digital signal samples, image digital signal samples and/or video digital signal samples may be sorted. In this context, any form of content or data, including content capable of being perceived by a human being using human hearing and/or visual human senses, may be made available in a digital signal and sorted in accordance with claimed subject matter. It may under some circumstances be desirable to sort digital signals because sorted digital signals may be advantageous for use in one or more compression schemes, for example. As just one example, it may be possible to express a set of sorted digital samples as a series of differences between adjacent values, which may result in desirable compression. It should, however, be noted that this is merely an example of a potential use of sorted digital signals and that claimed subject matter is not limited in this regard.

Nonetheless, continuing with this audio signal example, an audio sample may comprise a portion of audio signal content available in a digital signal form. Without loss of generality, for example, the audio sample may have a particular size in terms of the amount of memory space it may occupy, it may last for a particular amount of time if played at a particular digital signal sample rate, the audio content if played may exhibit audible sounds within a particular audio frequency range, and/or the audio sample may exhibit one or more other characteristics that may be associated with audio content.

Continuing with this example for this particular embodiment, audio digital signal samples may be grouped into one or more blocks of data, such as blocks 110 and/or 112, illustrated in FIG. 1. As used herein, a "block" may refer to a group of audio digital signal sample values. Typically, although not necessarily, each audio digital signal sample value in a block will have its own set of particular characteristics. Again, this is merely one example, here relating to audio samples in particular, and claimed subject matter is not limited in this regard.

With regard to FIG. 1, although claimed subject matter is not limited in scope in this respect, embodiment 100 may comprise a compression scheme in which an audio sample may have been encoded into a series of consecutive Pulse-Code-Modulated (PCM) audio digital signal sample values. As used herein, the term "encoding" may refer to converting a signal from one format to another format, such as converting the signal into a numerical representation of the content, data or other information, such as into a binary digital format, for example. For example, encoding may comprise converting a signal into a series of bits or binary digital signal samples, such as 1 or 0. As used herein, the term "decoding" may mean to extract the underlying meaning, data, or information from an encoded value. For example, decoding may comprise extracting the content, data or other information from a series of bits. As used herein, the term "pulse code modulated" may mean a digital representation of an analog signal. For example, a pulse code modulated signal may comprise a digital representation of an analog signal whose magnitude has been sampled at a regular interval. The sampled magnitudes may be quantized to a series of digital symbols, for example.

As just one example, blocks 110 and/or 112 may comprise one or more consecutive audio digital signal sample values of an audio sample, such as eleven consecutive sample values. While, this example embodiment is described in terms of eleven audio sample values, of course, smaller and/or larger block lengths in terms of samples values, for example, may alternatively be used. For example, audio blocks 110 and/or 112 may under some circumstances comprise an even number of sample values and under other circumstances comprise an odd number of sample values. Accordingly, claimed subject matter is not limited to any particular number of digital signal sample values.

Again referring to FIG. 1, PCM audio digital signal sample values may be represented as a series of signed integer values organized into one of more groups, such as blocks 110 and/or 112, for example. Thus, in this example, the values in blocks 110 and/or 112 may, under some circumstances, be represented as a series of signed integer values grouped into blocks of 11 consecutive audio sample values.

Embodiment 100 may be operable to sort block 110 and/or 112 into ascending order, such that successive audio sample values in the sorted block have higher integer values than the preceding audio sample values. For example, embodiment 100 may include sort module 113. Under some circumstances, sort module 113 may be operable to sort blocks of PCM audio sample values, such as 110 and/or 112, for example, into a sorted sequence of audio sample values 114.

Although depicted as an ascending sort, sorted sequence of audio samples 114 may alternatively comprise differently arranged sorts, such as a descending sort, for example. As used herein the term "sort" may mean to consecutively arrange data and/or digital signal sample values based at least in part on one or more characteristics of the data and/or digital signal sample values. For example, sorting one or more audio digital signal sample values may comprise arranging the one or more audio digital signal samples based at least in part on the magnitude of the respective audio digital signal sample values. It should, of course, again be noted that these are merely illustrative examples relating to sorting and that claimed subject matter is not limited in this regard.

In an embodiment, the sorting process may also generate a permutation value, depicted in FIG. 1 as value 116, wherein the permutation value may comprise information that may be used to restore the PCM audio digital signal sample values in blocks 110 and/or 112 to the order prior to being sorted. As used herein a "permutation value" may mean information which may, at least in part, be indicative of an order of a set of sorted sample values prior to the sample values being sorted. For example, a "permutation value" may comprise a symbol, which under some circumstances may be used to reproduce an order for a set of sorted audio samples. In an embodiment, permutation value 116 may comprise a symbol which may be associated with a block of sorted data, and which may provide information to reorder the block of sorted data. Typically, although not necessarily, a reorder process may be part of a more general decoding process, as discussed more fully below. For example, without loss of generality, in an embodiment, a decoding process may employ a permutation value, at least in part, to restore an order of the sorted sample values corresponding to blocks 110 and/or 112. Though, it should be noted that these are merely illustrative examples relating to a permutation value and that claimed subject matter is not limited in this regard.

In an embodiment, permutation value 116 may be computed at least in part contemporaneously and/or concurrently with sorting PCM audio digital signal sample values. By way of example, suppose unsorted sample values, associated with the sorted audio digital signal sample values in blocks 110 and/or 112, may be represented as the following:

$$\{V_0, V_1, V_2, \ldots V_n\}$$

In one embodiment of a sort process, a first value, $V_0$, may be moved to any of n positions, a second value, $V_1$, may be moved to any of n−1 positions, and so on for the set of values in a particular block. This results in a total of n! (n factorial) possible permutation values, each permutation value corresponding to a particular unique order out of all possible unique orders for the block.

A variety of ways are potentially available to encode a permutation value. Claimed subject matter is not limited in scope to any particular approach. Rather, any one of a variety of approaches may be employed. Several examples are provided below. A permutation value may be encoded by encoding a move in binary in ceil(log 2(p)) number of bits, where p is the number of possible values for a specific move. In an embodiment wherein a block of audio samples comprises 11 audio samples, this approach results in a permutation value that can be encoded in approximately in 4+4+4+3+3+3+3+2+2+1 bits, or 29 bits. As an alternative, it may be desirable to encode the permutation using a different scheme to produce a more compact result. For example, it may be desirable to encode the permutation in a few as log 2(n) bits, where n corresponds to the number of values in a block of audio values. For example, when n is equal to 11 it may, under some circumstances be desirable to encode the permutation value in as few as 25.25 bits. Though, of course, these are merely illustrative examples relating to encoding a permutation value and claimed subject matter is in no way limited to this particular example.

Another possible technique for encoding the permutation value could involve the use of factoradics. In this embodiment, if a block of n audio sample values is sorted, as described in more detail below, in one particular embodiment, the moves of individual values may be numbered $M_0$ through $M_n$. In an example, employing a block length of 11, the individual movement may be numbered $M_0$ through $M_{10}$. For example, in this embodiment, the permutation value may be encoding according to the following formula:

$$\sum_{0...n} M_n * n!$$

In this example, the permutation value comprises the summation of individual movements multiplied by successively larger factorials. For example, assuming block 110 includes 11 values, the permutation value 116 associated with sorted samples 114 may, under some circumstances, be encoded in approximately 26 bits. Though, again, this is merely an illustrative example relating to permutation values and claimed subject matter is not limited in this regard.

In an embodiment employing an insertion sort process, encoding a permutation value may occur concurrently with the sort process, as described below. Although, of course, claimed subject matter is not limited in scope to employing an insertion sort process. Any sorting process may, of course, be employed. However, in an embodiment, for example, as suggested above, employing an insertion sort, a sort module 113 may process a block of audio sample values, such as block 110, and produce a set of sorted samples, such as sorted samples 114, concurrently with permutation encoding 116. Without loss of generality, a specific example is discussed below for purposes of illustration.

FIG. 2A is a schematic diagram depicting a sorting process for a set of unsorted audio samples 200 in accordance with an embodiment. In this embodiment, again, the sort process comprises an insertion sort. For example, an insertion sort may build a set of sorted values by taking successive values from the set of unsorted values and determining where to insert a particular value in the set of sorted values. In this embodiment, the set of sorted values is initially empty so the first value is inserted at position 0, if using zero-based indexing. In this embodiment, the next value from the set of unsorted values may be inserted at either position 0 or position 1. In addition, a third value from the set of unsorted values may be inserted at position 0, position 1, or position 2. The sort process may continue until all values from the set of unsorted values have been inserted into a position. In this embodiment, values on either side of a point at which a value is to be inserted are shifted to the left or to the right to make room for the subsequent value. Furthermore, a point to insert a particular value is selected, at least in part, so that the particular value is between the values on either side of the point at which the particular value is to be inserted. Accordingly, an output list may comprise a sorted set of values. In this embodiment, the permutation value may correspond to the series of locations at which values are inserted. For example, for a set of N audio sample values, there are N! different insertion location combinations.

Referring again to FIG. 2A, in this embodiment, the sorting process begins with a first value 201 in the set of unsorted audio samples. In this example, the sort process generates a 0 insertion position for first value 201. The sorting process then proceeds to a next value 202 and determines if the value is larger or smaller than first value 201. In this example, second value 202 is larger than first value 201 so it is inserted after first value 201 and assigned the insertion position of 1. The sort process proceeds through the subsequent values of unsorted audio samples 200 and, for each value, determines an insertion position or location for that value based at least in part on a comparison of the values. Returning to our example, the process proceeds to a third value 203 and determines an insertion location because it is larger than first value 201 but smaller than second value 202. Therefore, the third value 203 is inserted after first value 201 and before second value 202. The sort process further assigns an insertion position of 1 for third value 203. Again, referring to our example, the sort process proceeds to a fourth value 204. This value is larger than first value 201, second value 202, and third value 203. Accordingly, the sort process inserts fourth value 204 after second value 202 and assigns it an insertion position of 3. Finally, in our example, the sort process proceeds to fifth value 205. This value is smaller than first value 201 and the sort process inserts fifth value 205 in front of first value 201. Fifth value 205 is also assigned an insertion value of 0. In this embodiment, the sort process has now produced a sorted set of audio sample values 210 along with a permutation value 212, which, in an embodiment, comprises a set of insertion values. Though, of course, it should be noted that these are merely illustrative examples relating to a sort process and that claimed subject matter is not limited in this regard.

FIG. 2B is a schematic diagram depicting an unsorting or reordering process for restoring the order of audio samples 200 from sorted audio samples 210. Referring now to FIG. 2B, the reordering process uses permutation value 212 at least in part to restore the order of unsorted audio samples 200. In an embodiment, the reorder process can restore the order of unsorted audio samples 200, at least in part, by reversing the order of the insertion values in represented as permutation value 212. This results in a list of removal positions 220, which may be used to remove audio sample values from sorted audio sample values 210. As a value is removed the values to the left or right are moved to close the gap. In the example shown in FIG. 2B, the first removal position is position 0. Accordingly, the reorder process removes the value at the 0 position from line 221 and places that value in the restored list. The next removal position in the list of removal points 220 is 3. Accordingly, the reorder process removes the value at the 3 position from line 222 and places that value in the next position of restored list 220. The next removal position is 1, which results in the reorder process removing the value in the 1 position from line 223 and placing that value in the next position of restored list 220. The next removal point is again 1, and accordingly the reorder process removes the values from the 1 position of line 224 and places it in the next position in restored list 220. Finally, the last removal position is 0, and the reorder process places the remaining value from the 0 position in the next position in restored list 220. Though, it should be noted that these are merely illustrative examples relating to a reorder process and that claimed subject matter should not be limited in this regard.

In this particular embodiment, the removal positions may be determined by performing one or more operations to decode the permutation value. For example, if the permutation value was encoded using factoradics, the removal positions may be determined by dividing the permutation value by successively smaller factorials. In a case in which a set of sorted digital signal samples includes n values, the first removal position may be determined by dividing the permutation value by n!. The second removal position may be determined by dividing the remainder of the first calculation by n−1!. Subsequent removal positions may likewise be determined by dividing the remainder from the previous calculation by successively smaller factorials until all removal positions have been determined. For a more specific example, in the case where there are 11 values in the set of sorted digital signals, the first removal position may be determined by dividing the permutation value by 11!. The second removal position may be determined by dividing the remainder from the first calculation by 11-1!, and so on until all removal positions have been determined. Though, of course, it should be noted that these are merely illustrative examples relating to a reordering process and claimed subject matter is not limited in this regard.

A reorder module, such as reorder module 118, may be employed to reorder a sorted set of sample values. In this embodiment, reorder module 118 may be operable to process sorted samples 114 and permutation value 116. Reorder module 118 may be further operable to restore blocks 110, and/or 112 based on sorted samples 114 and permutation value 116. For example, reorder module 118 may be operable to determine a series of removal points by performing one or more operations on permutation value 116. For example, if permutation value 116 was encoded using factoradics, reorder module 118 may be operable to divide, or perform an equivalent operation to, permutation value 116 with n!, where n equals the number of digital signal sample values in sorted samples 114, to obtain a first removal position. Furthermore, reorder module 118 may be further operable to divide the remainder from the first calculation by n−1! to determine a second removal position. Reorder module 118 may continue to divide the remainder of the calculation with successively smaller factorials until the removal positions have been determined. Though, it should be noted that these are merely illustrative examples relating to a reorder process and that claimed subject matter is not limited to these examples. In an embodiment, reorder module 118 may be further operable to extract individual values based on the determined removal positions, at least in part, to restore the set of samples in blocks 110 and/or 112 to their order prior to being sorted, though, again, claimed subject matter is not limited in this regard.

FIG. 3 is a flow chart depicting a sort process 300 in accordance with an embodiment. With regard to flow chart block 310, sort process 300 may begin with a set of digital signal samples. As discussed above, the set of digital signal samples may comprise one or more PCM audio values represented as a series of signed integer values organized into one of more groups, such as blocks 110 and/or 112, for example. Though, this is merely an example relating to digital signal sample values and claimed subject matter is not limited in this regard. With regard to flow chart block 320, sort process 300 may reorder the set of digital signal samples values based on one or more characteristics of the digital signal sample values. For example, sort process 300 may reorder the digital signal sample values based on the integer value associated with the digital signal sample values. Furthermore, sort process 300 may reorder the digital signals sample values into ascending and/or descending order, for example. As just one example, sort process 300 may reorder the digital signal sample values using one or more insertions sort processes, such as the insertion sort described above with regard to FIG. 2A.

With regard to flow chart block 330, sort process 300 may further operate to encode a permutation value corresponding to a particular reordering of the digital signal sample values. For example, the permutation value may be encoded in a number of ways, as discussed above, including using factoradics. As discussed above, a set of digital signal sample values be sorted and the movements of individual signal values may be numbered M0 through M10. In this embodiment, the permutation value may be encoded according to the following formula:

$$\sum_{0\ldots n} M_n * n!$$

In this embodiment, the permutation value may comprise the summation of the individual movements respectively multiplied by successively larger factorials. Under some circumstances, this may result in computational advantages for decoding the individual movements from the encoded permutation value. As discussed above, the sorted samples may be useful in one or more compression schemes, such as an compression scheme employing one or more Rice coding techniques to encode a difference between adjacent values from the set of sorted samples. Though, of course, this is merely an illustrative example relating to a permutation value and claimed subject matter is not limited in this regard.

Figure 4:
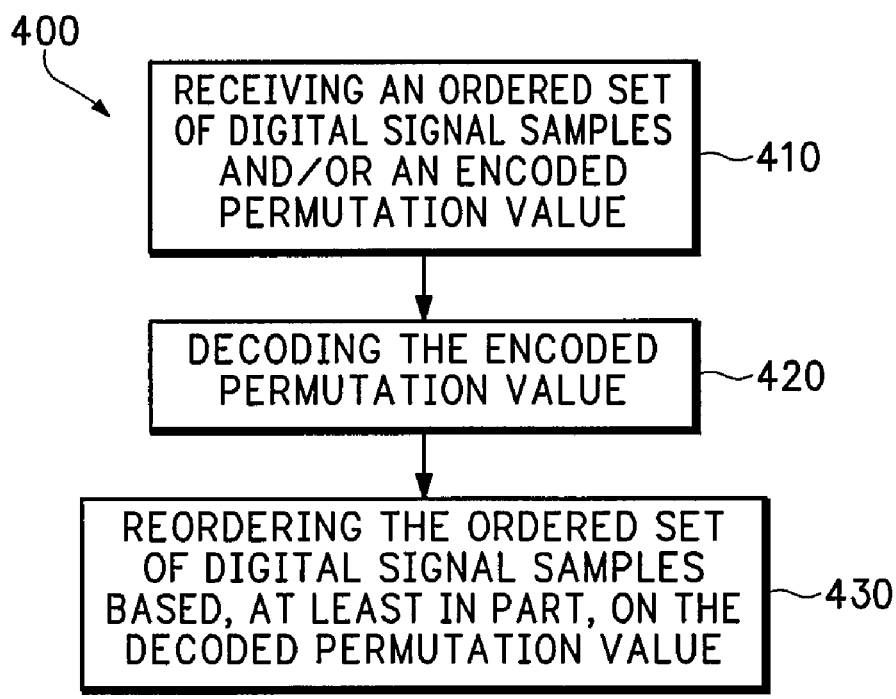
FIG. 4 is a flow chart of a reorder process for the embodiment of FIG. 3.

FIG. 4 is a flow chart of a reorder process 400 in accordance with an embodiment. With regard to flow chart block 410, reorder process 400 may receive an order set of digital signal sample values and/or an encoded permutation value. In this example, the ordered set of digital signal sample values may comprises a set of sorted digital signal sample values. The set of sorted digital signal sample values may, as discussed above, have been sorted by magnitude using an insertion sort process, to provide a descending or ascending order, for example. Furthermore, as discussed above, the encoded permutation value may comprise a number representing one or movements of the unsorted digital signal sample values during a sorting process and may have been encoded using factoradics. However, it should be noted that these are merely illustrative examples relating to a set of sorted digital signal sample values and/or a permutation value and claimed subject matter is not limited in this regard.

With regard to flow chart block 420, reorder process 400 may decode the encoded permutation value. For example, if the permutation value was encoded using factoradics, the removal positions may be determined by dividing the permutation value by successively smaller factorials. Where, for example, the set of sorted digital signal sample values includes n values, the first removal position may be determined by dividing the permutation value by n!. The second removal position may be determined by dividing the remainder of the first calculation by n−1!. Subsequent removal positions may likewise be determined by dividing the remainder from the previous calculation by successively smaller factorials until the removal positions have been determined. Alternatively, in an embodiment, instead of division a multiplication process may be used. For example, a scale approximation of the permutation value may be multiplied by 1/N!. This value may then be right shifted to determine the first removal point. However, due to rounding errors this process may, under some circumstances, generate a removal point value that is one larger than the correct value. An error of this type may be detected by multiplying the determined removal point value by the appropriate factorial value, such as N! for the first removal point, and verifying that the product is not larger than the permutation value. If the product is larger than the permutation value, reducing the determined removal point value by one yields the correct value for the particular removal point. A similar multiplication and verification process may likewise be used to determine subsequent removal points. For a more specific example, in the case where there are 11 values in the set of sorted digital signal sample values, the first removal position may be determined by dividing the decoded permutation value by 11!. The second removal position may be determined by dividing the remainder from the first calculation by 11-1!, and so on until the removal positions have been determined. Though, of course, it should be noted that these are merely illustrative examples relating to a reordering process and claimed subject matter is not limited in this regard.

With regard to flow chart block 430, reorder process 400 may use the decoded permutation value and/or the determined removal positions so that the ordered set of digital signal sample values may be returned to their order prior to being sorted. For example, the first removal position may be used to remove the last value of the unordered set of digital signals sample values. Likewise, subsequent removal positions may be used until the order of the set of digital signal sample values prior to sorting has been restored. The reorder process may be useful for reconstructing a set of audio samples that were encoded, such as in one or more compression schemes. For example, the ordered set of audio samples may have been encoded at least in part by Rice coding one or more differences between adjacent samples from a set of sorted audio samples, and after Rice decoding those differences the original ordered set of samples may be reconstructed and the reorder process may be used to restore the original order of the audio samples. Though, again, it should be noted that these are merely illustrative examples relating to reordering an ordered set of digital signal samples and claimed subject matter is not limited in this regard.

In the preceding description, various aspects of claimed subject matter have been described. For purposes of explanation, specific numbers, systems and/or configurations were set forth to provide a thorough understanding of the claimed subject matter. However, it should be apparent to one skilled in the art having the benefit of this disclosure that claimed subject matter may be practiced without the specific details. In other instances, features that would be understood by one or ordinary skill were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method of sorting digital signal samples for use in a compression scheme, said method comprising:
   reordering at a computing platform, a set of digital signal samples, said set having an initial arrangement and said reordering being based at least in part on one or more characteristics of said digital signal samples; and
   encoding at said computing platform, a permutation corresponding to the particular reordering, wherein said reordering and encoding the permutation are performed concurrently.

2. The method of claim 1, wherein said set of digital signal samples comprise content capable of being perceived by humans.

3. The method of claim 2, wherein said content includes signals representing sound, images, video and/or text.

4. The method of claim 1, wherein said one or more characteristics of said digital signal samples comprise a magnitude of the individual samples.

5. The method of claim 4, wherein said reordering comprises any sorting process.

6. The method of claim 5, wherein said sorting process comprises an insertion sort.

7. The method of claim 1, wherein said permutation comprises a sequence of operations operable to return the reordered set to its order prior to said reordering.

8. The method of claim 7, wherein said sequence of operations is encoded using factoradics.

9. The method of claim 6, wherein said sequence of operations are encoded by multiplying successive operations by successively larger factorials.

10. The method of claim 9, wherein said sequence of operations are further encoded by summing the multiplying results.

11. A method of restoring a set of digital signal samples for use in a decompression scheme, said method comprising:
    decoding at a computing platform, an encoded permutation value; and
    reordering at a computing platform, an ordered set of digital signal samples, wherein the digital signal samples were ordered according to one or more characteristics of the digital signal samples, wherein said permutation value was encoded concurrently to the ordering of the digital signal samples, and wherein said reordering is based at least in part on the decoded permutation value.

12. The method of claim 11, wherein said set of digital signal samples comprise content capable of being perceived by humans.

13. The method of claim 12, wherein said content includes signals representing sound, images, video and/or text.

14. The method of claim 11, wherein said ordered set of digital signal samples comprises said set of digital signal samples ordered by magnitude.

15. The method of claim 13, wherein said ordered set of digital signal samples has been ordered according to any sorting process.

16. The method of claim 15, wherein said sorting process comprises an insertion sort.

17. The method of claim 11, wherein said encoded permutation value comprises a sequence of operations used to order the set of digital signal samples.

18. The method of claim 17, wherein said sequence of operations comprise a sequence of insertion points.

19. The method of claim 18, wherein said reordering comprises using said sequence of insertion points as a sequence of removal points to restore the original order of the set of digital signal samples.

20. The method of claim 19, wherein said sequence of insertion points are decoded using factoradics.

21. The method of claim 19, wherein a first removal point is decoded by determining the result of dividing said permutation value by N!, wherein N is equal to a number of values in the set of digital signal samples.

22. The method of claim 21, wherein subsequent removal points are decoded by determining the result of dividing a remainder of a previous determined result by successively smaller factorials.

23. An article of manufacture comprising: a computer readable medium having stored thereon instructions that, if executed by a computing platform, enable said computing platform to:

reorder a set of digital signal samples, said set having an initial arrangement and said reordering being based at least in part on one or more characteristics of said digital signal samples; and encode a permutation corresponding to the particular reordering, wherein said reordering and encoding the permutation are performed concurrently.

24. The article of manufacture of claim 23, wherein said set of digital signal samples comprise content capable of being perceived by humans.

25. The article of manufacture of claim 24, wherein said content includes signals representing sound, images, video and/or text.

26. The article of manufacture of claim 23, wherein said one or more characteristics of said digital signal samples comprise a magnitude of the individual samples.

27. The article of manufacture of claim 26, wherein said instructions, if executed by said computing platform, further enable said computing platform to reorder said set of digital samples using any sorting process.

28. The article of manufacture of claim 27, wherein said sorting process comprises an insertion sort.

29. The article of manufacture of claim 23, wherein said permutation comprises a sequence of operations operable to return the reordered set to its order prior to said reordering.

30. The article of manufacture of claim 29, wherein said sequence of operations is encoded using factoradics.

31. The article of manufacture of claim 29, wherein said sequence of operations are encoded by multiplying successive operations by successively larger factorials.

32. The article of manufacture of claim 31, wherein said sequence of operations are further encoded by summing the multiplying results.

33. An article of manufacture comprising: a computer readable medium having stored thereon instructions that if executed by a computing platform, enable said computing platform to:

decode an encoded permutation value; and reorder an ordered set of digital signal samples, wherein the digital signal samples were ordered according to one or more characteristics of the digital signal samples, wherein said permutation value was encoded concurrently to the ordering of the digital signal samples, and wherein said reordering is based at least in part on the decoded permutation value.

34. The article of manufacture of claim 33, wherein said set of digital signal samples comprise content capable of being perceived by humans.

35. The article of manufacture of claim 34, wherein said content includes signals representing sound, images, video and/or text.

36. The article of manufacture of claim 33, wherein said ordered set of digital signal samples comprises said set of digital signal samples ordered by magnitude.

37. The article of manufacture of claim 35, wherein said ordered set of digital signal samples has been ordered according to any sorting process.

38. The article of manufacture of claim 37, wherein said sorting process comprises an insertion sort.

39. The article of manufacture of claim 33, wherein said encoded permutation value comprises a sequence of operations used to order the set of digital signal samples.

40. The article of manufacture of claim 39, wherein said sequence of operations comprise a sequence of insertion points.

41. The article of manufacture of claim 40, wherein said instructions, if executed by said computing platform, further enable said computing platform to reorder said set of digital samples using said sequence of insertion points as a sequence of removal points to restore the original order of the set of digital signal samples.

42. The article of manufacture of claim 41, wherein said sequence of insertion points are decoded using factoradics.

43. An apparatus for use in a compression scheme, said apparatus comprising:

a computing platform operable to reorder a set of digital signal samples, said set having an initial arrangement and said reordering being based at least in part on one or more characteristics of said digital signal samples; and said computing platform operable to encode a permutation corresponding to the particular reordering, wherein said computing platform is operable to reorder and encode the permutation concurrently.

44. The apparatus of claim 43, wherein said set of digital signal samples comprise content capable of being perceived by humans.

45. The apparatus of claim 44, wherein said content includes signals representing sound, images, video and/or text.

46. The apparatus of claim 43, wherein said one or more characteristics of said digital signal samples comprise a magnitude of the individual samples.

47. The apparatus of claim 46, wherein said reordering comprises any sorting process.

48. The apparatus of claim 47, wherein said sorting process comprises an insertion sort.

49. The apparatus of claim 43, wherein said permutation comprises a sequence of operations operable to return the reordered set to its order prior to said reordering.

50. The apparatus of claim 49, wherein said sequence of operations is encoded using factoradics.

51. The apparatus of claim 48, wherein said sequence of operations are encoded by multiplying successive operations by successively larger factorials.

52. The apparatus of claim 51, wherein said sequence of operations are further encoded by summing the multiplying results.

53. An apparatus for use in a decompression scheme, said apparatus comprising:

a computing platform operable to decode an encoded permutation value; and said computing platform further operable to reorder an ordered set of digital signal samples, wherein the digital signal samples were ordered according to one or more characteristics of the digital signal samples, wherein said permutation value was encoded concurrently to the ordering of the digital signal samples, and wherein said reordering is based at least in part on the decoded permutation value.

54. The apparatus of claim 53, wherein said digital signal samples comprise content capable of being perceived by humans.

55. The apparatus of claim 54, wherein said content includes signals representing sound, images, video and/or text.

56. The apparatus of claim 53, wherein said ordered set of digital signal samples comprises said set of digital signal samples ordered by magnitude.

57. The apparatus of claim 55, wherein said ordered set of digital signal samples has been ordered according to any sorting process.

58. The apparatus of claim 57, wherein said sorting process comprises an insertion sort.

59. The apparatus of claim 53, wherein said encoded permutation value comprises a sequence of operations used to order the set of digital signal samples.

60. The apparatus of claim 59, wherein said sequence of operations comprise a sequence of insertion points.

61. The apparatus of claim 60, wherein said reordering comprises using said sequence of insertion points as a sequence of removal points to restore the original order of the set of digital signal samples.

62. The apparatus of claim 61, wherein said sequence of insertion points are decoded using factoradics.

* * * * *